United States Patent
Halpin et al.

(10) Patent No.: US 12,206,191 B2
(45) Date of Patent: Jan. 21, 2025

(54) BLIND ELECTRICAL CONNECTION IN A MOTOR CONTROL CENTER THROUGH SPRING CONTACTS

(71) Applicant: Rockwell Automation Technologies, Inc., Mayfield Heights, OH (US)

(72) Inventors: Peter J. Halpin, Fox Point, WI (US); Todd R. Sauve, Oak Creek, WI (US); Troy M. Bellows, Racine, WI (US); Corey A. Peterson, Grafton, WI (US); Robert Dilgard, Shorewood, WI (US); Calvin C. Steinweg, Hartford, WI (US); Roberto Marques, Mequon, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 385 days.

(21) Appl. No.: 17/730,638

(22) Filed: Apr. 27, 2022

(65) Prior Publication Data
US 2023/0352863 A1 Nov. 2, 2023

(51) Int. Cl.
*H01R 12/71* (2011.01)
*H01R 13/24* (2006.01)
(Continued)

(52) U.S. Cl.
CPC ........... *H01R 12/714* (2013.01); *H01R 43/26* (2013.01); *H02K 11/30* (2016.01); *H05K 7/14* (2013.01);
(Continued)

(58) Field of Classification Search
CPC ...... H01R 12/714; H01R 43/26; H05K 11/30; H05K 7/14
(Continued)

(56) References Cited

U.S. PATENT DOCUMENTS

| | | | |
|---|---|---|---|
| 5,510,960 A * | 4/1996 | Rosen | H01R 9/2425 361/624 |
| 2012/0081841 A1* | 4/2012 | Blodorn | H05K 7/1484 29/592.1 |

(Continued)

FOREIGN PATENT DOCUMENTS

| | | |
|---|---|---|
| EP | 2826116 B1 | 11/2018 |
| WO | 02087037 A1 | 10/2002 |
| WO | 2005053369 A1 | 6/2005 |

OTHER PUBLICATIONS

Allen-Bradley by Rockwell Automation; Centerline 2500 Low Voltage Motor Control Centers and Switchgear Assemblies; Rockwell Automation Publication 2500-SG001H-EN-P—Mar. 2021—(76) pages.

(Continued)

*Primary Examiner* — Gary F Paumen
(74) *Attorney, Agent, or Firm* — Boyle Fredrickson, S.C.

(57) ABSTRACT

A system for control of motors for industrial applications including a motor control center and motor control unit. The motor control center having at least one printed circuit board, and a motor control unit having at least one pin. At least one pin includes a barrel, a plunger, and a spring. The motor control unit is selectively insertable into the motor control center, whereas the at least one pin transitions from the first position to the second position upon insertion and the at least one pin connects to the at least one printed circuit board forming an electrical connection between the motor control center and motor control unit.

20 Claims, 5 Drawing Sheets

(51) Int. Cl.
  *H01R 43/26* (2006.01)
  *H02K 11/30* (2016.01)
  *H05K 7/14* (2006.01)

(52) U.S. Cl.
  CPC ...... *H01R 13/2407* (2013.01); *H02K 2211/03* (2013.01)

(58) Field of Classification Search
  USPC .......................................................... 439/66
  See application file for complete search history.

(56) References Cited

U.S. PATENT DOCUMENTS

| | | | |
|---|---|---|---|
| 2015/0255966 A1* | 9/2015 | Oneufer | H02B 1/32 |
| | | | 361/631 |
| 2016/0241114 A1* | 8/2016 | Cullen | H02K 11/28 |
| 2018/0145486 A1* | 5/2018 | Kroushl | H02B 1/36 |
| 2018/0219359 A1* | 8/2018 | Francisquini | H02B 11/173 |
| 2019/0252865 A1* | 8/2019 | Bellows | H02B 1/306 |
| 2020/0078119 A1* | 3/2020 | Henderson | A61B 90/90 |

OTHER PUBLICATIONS

European Search Report and Written Opinion for European Application No. EP23169473.8 dated Sep. 22, 2023 (14 pages).

* cited by examiner

BLIND ELECTRICAL CONNECTION IN A MOTOR CONTROL CENTER THROUGH SPRING CONTACTS

BACKGROUND INFORMATION

The subject matter disclosed herein relates to a method of engagement between a low voltage motor control unit and a low voltage motor control center. More specifically, spring loaded contacts of the low voltage motor control unit engage a printed circuit board of the low voltage motor control center thereby allowing a blind connection between the motor control unit and the motor control center.

As is known to those skilled in the art, motor control systems, such as motor control centers, are used in a variety of industrial and automation applications. A motor control center is an assembly of one or more enclosed vertical metal cabinet sections having vertical and horizontal buses for distributing power. A section may be a stand-alone complete motor control center, or several sections may be bolted together and have electrical busses connected between the sections. The low voltage motor control center allows for plug-in mounting of motor control units for engagement between the motor control units and the motor control center. An enclosure or housing surrounds the equipment to prevent contact with live buses and connections, as well as protects equipment from environmental conditions.

Each motor control unit receives power as well as control signals. Power is commonly provided via a power bus extending vertically or horizontally behind the chassis of the motor control unit. Power is commonly a three-phase AC voltage. Metal, stab connectors positioned on the rear of each control unit, engage receptacles mounted to the bus. The control signals are routed via discrete conductors, network cables, or a combination thereof in wireways extending vertically or horizontally through the motor control center. At each compartment for a motor control unit, multiple wires extend from the wireway into the cavity configured to receive the motor control unit to connect the motor control unit within a motor control center. Separate wires are used to transmit different types of data signals, control signals, and/or network connections to different motor control units and other components within the motor control system. Thus, motor control centers must accommodate connections between each motor control unit and the wiring within each wireway.

These wires or connections, however, can cause issues. The wires can complicate maintenance tasks, cause delays in installation, and further cause difficulties in reconfigurations of the system. Additionally, low voltage motor control centers and motor control units have little space to accommodate a control connection. The motor control units become tethered to the motor control center as they are inserted into the motor control center. Connections are established to the data signals, control signals, and/or networks via terminals or plug in connectors. The network and control connections must then be unplugged before the motor control unit can be removed. There is a chance for the cables to be damaged when trying to remove the motor control unit from or insert the motor control unit into the motor control center. Additionally, the cable connections may be misconnected or not connected at all when the motor control unit is installed in the motor control center.

While attempts have been made to solve such issues, such attempts have not fully solved the issues without incurring various disadvantages. Thus, it would be desirable to provide a method of engaging and disengaging the motor control unit and motor control center without needing to connect and disconnect cable connections.

BRIEF DESCRIPTION

According to one embodiment of the invention, a motor control center for industrial equipment includes at least one power bus configured to receive power from a power supply and to distribute the power within the motor control center. The motor control center has multiple compartments, where each compartment is configured to receive a motor control unit inserted within the respective compartment. Multiple terminals are mounted within each of the compartments, and the terminals are configured to engage at least one pin extending from the motor control unit as the motor control unit is inserted within one of the compartments. Each of the plurality of terminals causes the at least one pin to transition from a first position to a second position as the at least one pin is engaged, and an electrical connection is established between the motor control center and motor control unit by the at least one pin engaging one of the terminals.

According to another embodiment of the invention, a motor control unit is configured for insertion into a compartment of a motor control center. The motor control unit includes at least one electrical device configured to receive a control signal, a data signal, or a data packet corresponding to a desired operation of the electrical device. The motor control unit also includes a printed circuit board and at least one pin mounted to the printed circuit board. The at least one pin is configured to engage one terminal pad, selected from multiple terminal pads mounted on a second printed circuit board. The second printed circuit board is located within the compartment of the motor control center, and an electrical connection is established between the motor control center and motor control unit by the at least one pin engaging the corresponding terminal pad. The at least one pin is configured to transition from a first position to a second position upon insertion of the motor control unit into the compartment of the motor control center, and the control signal, data signal, or data packet is conducted to the motor control unit from the motor control center via the electrical connection.

According to still another embodiment of the invention, a method of selective engagement and disengagement between a motor control unit and a motor control center is disclosed. The method includes manually inserting the motor control unit into a compartment on the motor control center, where the manual insertion further includes inserting at least one power stab, mounted to the motor control unit, into a power receptacle within the motor control center and establishing a first electrical connection to deliver power from a power bus within the motor control center to the motor control unit via the power receptacle and the at least one power stab by manually inserting the motor control unit. The manual insertion causes at least one pin mounted to the motor control unit to transition from a first position to a second position, where the at least one pin engages a corresponding terminal within the motor control center during insertion. A second electrical connection is established to deliver a control signal, data signal, or data packet from the motor control center to the motor control unit via the at least one pin and the corresponding terminal while inserting the motor control unit without requiring an additional plug connection between the motor control center and the motor control unit.

The motor control unit described herein is therefore capable of being plugged into the motor control center with a "blind connection" to form an electric connection between the motor control center and motor control unit without needing to connect and disconnect additional cable connections.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description.

Figure 1:
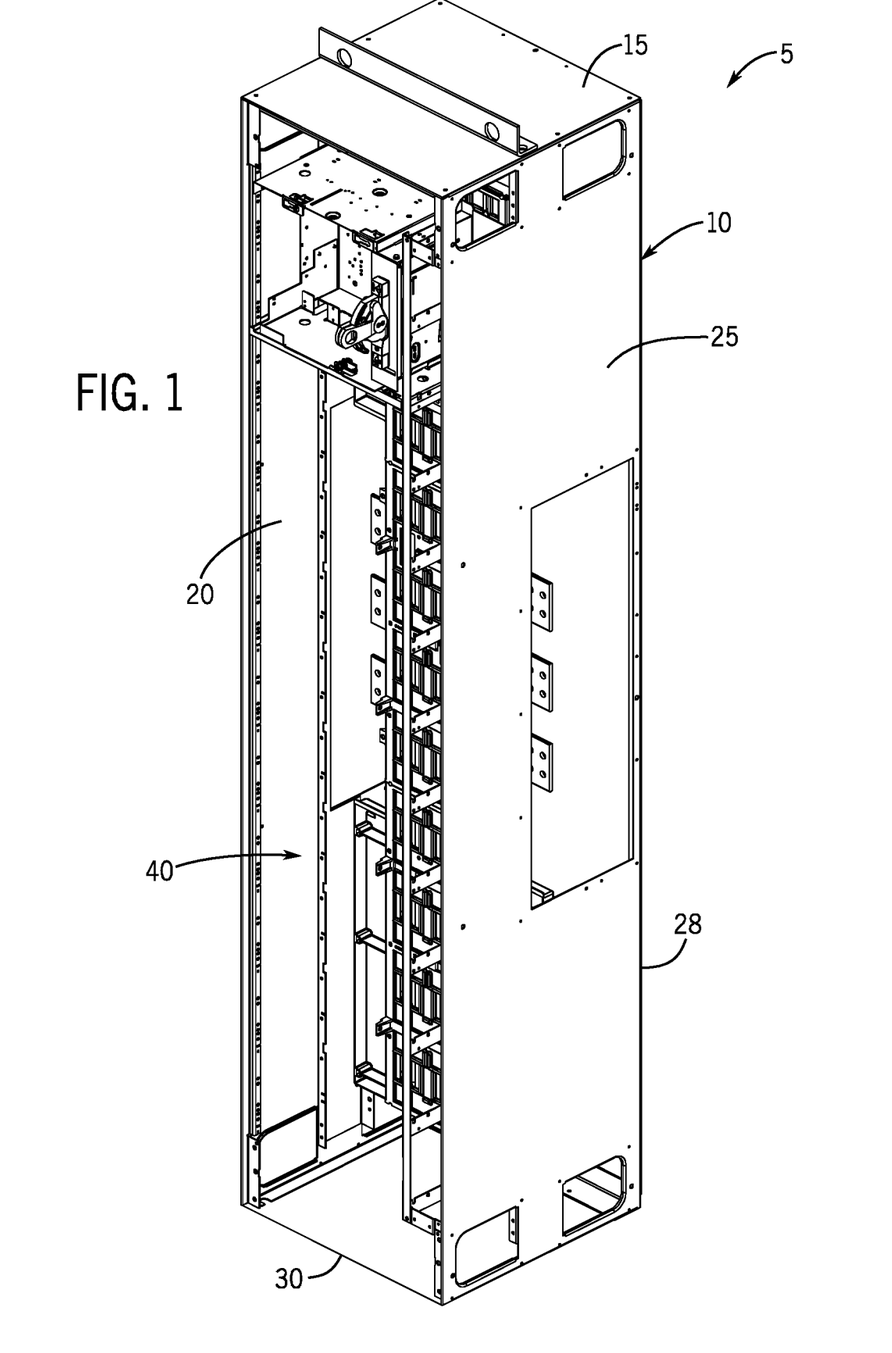
FIG. 1 is a perspective view of a motor control center.
Figure 2:
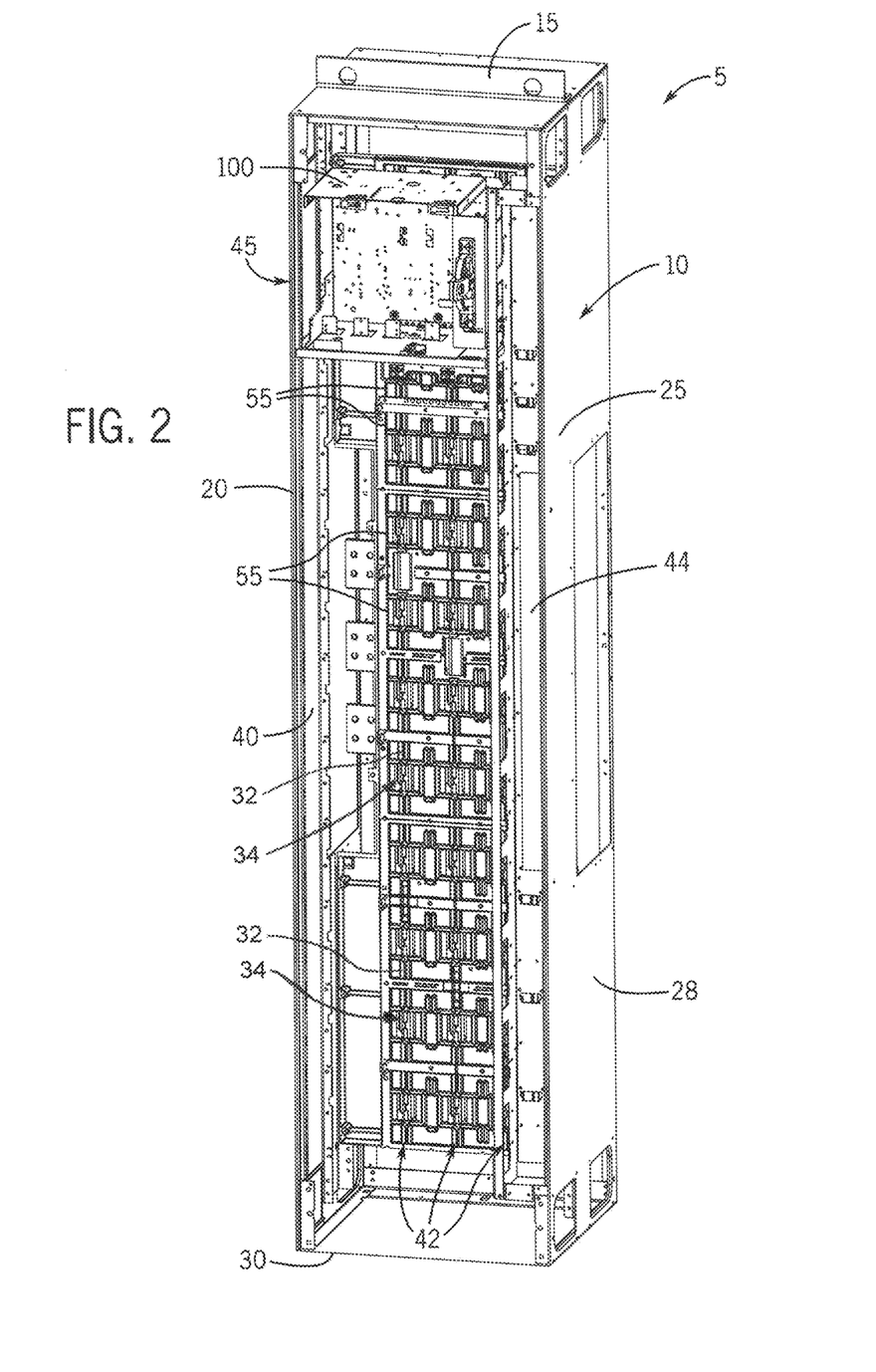
FIG. 2 is a rear view of the motor control center of FIG. 1.

In FIGS. 1 and 2, an electrical enclosure cabinet in the form of a motor control center 5 is illustrated. The motor control center 5 includes a housing 10 configured to enclose various electrical components. The housing 10 may be formed from heavy gauge sheet metal, although materials such as reinforced plastic may sometimes be used. The housing 10 has a top surface 15, a first sidewall 20, a second sidewall 25, rear wall 28, and bottom surface 30. The top surface 15 and bottom surface 30 are located opposite from one another, with the first sidewall 20 and second sidewall 25 located in-between and extending from the top surface 15 to the bottom surface 30. The rear wall 28 is further located adjacent to and extends between the top surface 15, a first sidewall 20, a second sidewall 25, and bottom surface 30. Together, the top surface 15, first sidewall 20, second sidewall 25, rear wall 28, and bottom surface 30 form the housing 10 which has a main interior cavity 40 in which components and components supports may be placed.

Figure 3:
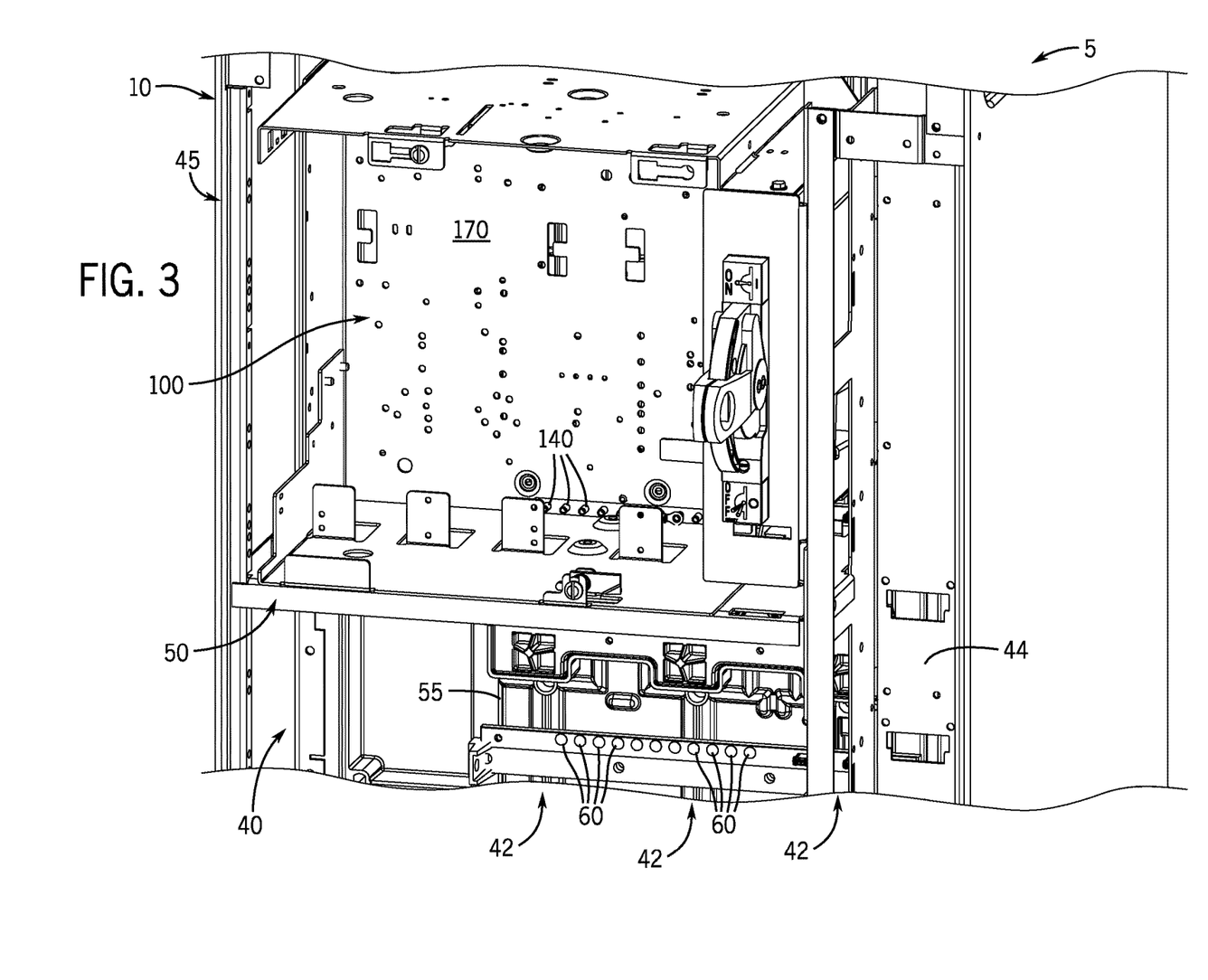
FIG. 3 is a partial perspective view of the motor control center of FIGS. 1 and 2.

With reference also to FIG. 3, the main interior cavity 40 may be further divided into compartments 45 by a support 50. The compartments 45 may receive specific components, such as components interconnected to form a portion of an overall process control or monitoring system. Each compartment 45 may be accessed through a main door (not shown), which may be secured in place with suitable fasteners such as screws or the like to hold the door closed over the main interior cavity 40 during normal operation. Alternately, each compartment 45 includes a blank cover when no component is inserted within the compartment or the front of a component, such as a motor control unit, provides the front surface for the compartment in which the component is inserted. The supports 50 may be spaced apart in various distances, allowing for components of different sizes to be inserted in or mounted to the motor control center 5. Motor control units 100 may be configured in different sizes according, for example, to the rating of a motor drive within the motor control unit. Other components may include programmable logic controllers, inverter drives, switchgear, input/output interfaces, and protective circuit components.

Figure 4:
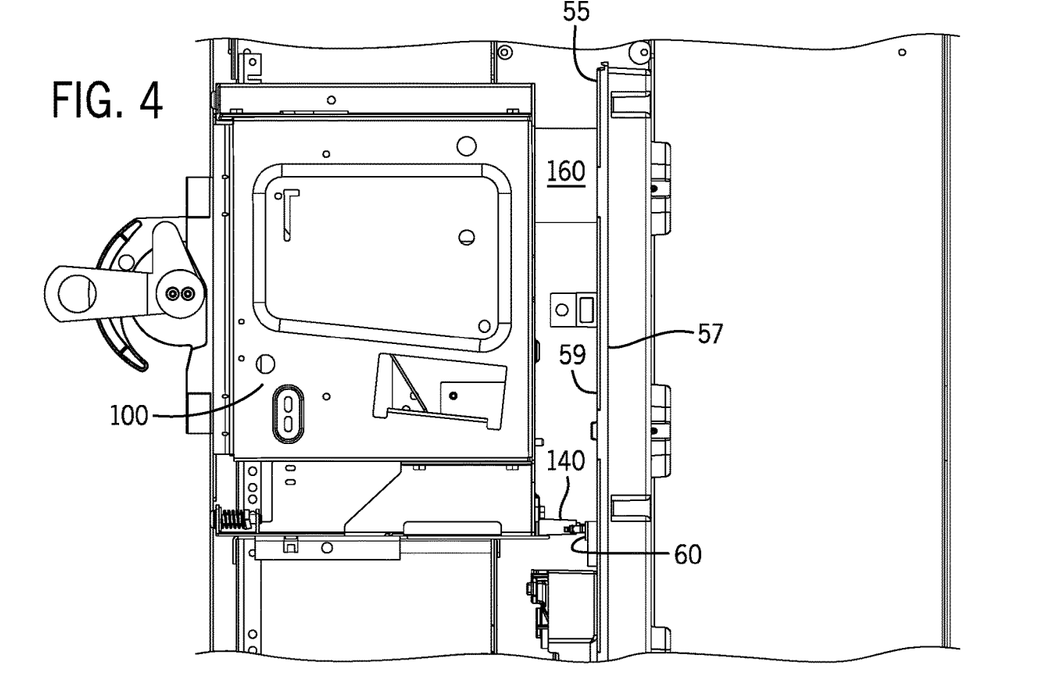
FIG. 4 is a side elevation view of a motor control unit inserted into a compartment of the motor control center of FIG. 1

A printed circuit board 55 is mounted toward the rear of each compartment 45. The printed circuit board 55 within each compartment facilitates electrical connections with each component inserted into the motor control center 5. According to the illustrated embodiment, each circuit board 55 includes receptacles 32 for power stab connectors 160. Power is provided to each receptacle 32 via a power bus 34 extending vertically behind the receptacles. Each circuit board also includes terminal pads 60 for establishing control and/or network connections with the component inserted into the compartment 45. With reference to FIGS. 3 and 4, a motor control unit 100 is inserted into one compartment 45. In FIG. 3, a row of terminal pads 60 is shown in a compartment 45 below the compartment in which the motor control unit 100 is inserted. FIG. 4 illustrates a side elevation view of the motor control unit 100 when it is inserted within the motor control center 5. A single terminal pad 60 is viewable from the side with a spring-loaded contact 140, as will be discussed in more detail below, establishing an electrical contact between the motor control unit 100 and the terminal pad 60. The printed circuit board 55 of the motor control center 5 is connected to and allows for the control of various industrial applications. The wires and/or cables run within the wireways 44 are connected to a rear surface 57 of the circuit board 55, and the terminal pads 60 are positioned on a front surface 59 of the circuit board. The wires and/or cables may be connected directly to rear surface 57 opposite the terminal pads 60 and extend through the circuit board 55 to the corresponding terminal pad. Optionally, the wires and/or cables may be connected at any location on the circuit board 55 and traces routed along the circuit board 55 to the corresponding terminal pad 60. Thus, the wires and/or cables which previously were connected to the motor control unit 100 during insertion of the motor control unit are now connected directly to the circuit board 55 within the compartment 45.

According to another embodiment of the invention, it is contemplated that the terminal pads 60 may be other receiving connector surfaces. As will be discussed in more detail below, the terminal pads 60 provide a complementary connection to spring-loaded pins 140 extending from a component being inserted into the motor control center 5. A row of connectors (not shown) may be mounted within a compartment 45 and aligned in a similar configuration as the terminal pads 60 illustrated in FIG. 3. The connectors preferably include a generally planar surface or a concave surface configured to receive the end 142 (see FIGS. 6-7) of a spring-loaded pin 140. A wiring harness may extend behind the row of connectors and establish an electrical connection to each connector within the compartment 45. The row of connectors establishes a similar mating surface to the terminal pads 60 and allows for the blind electrical connection to be established in the same manner as the terminal pads 60 of the illustrated embodiment.

As previously discussed, one of the components that may be inserted in the motor control center 5 is a motor control unit 100. When the motor control unit 100 is selectively engaged with the motor control center 5, the motor control unit 100 controls an electric motor (not shown), which is also connected to the motor control center, by starting or stopping the motor, selecting and regulating the speed, or protecting against overloads and electrical faults. Control of the motor may be performed by a motor drive or motor starter mounted within the motor control unit 100. The motor control unit 100 may also include a first contactor to selectively energize the motor drive or motor stator and a second contactor mounted between the motor drive or motor starter and the motor. A communication device, such as a router, switch, or other network device may be provided to interconnect between an industrial network and the motor drive or motor starter. Optionally, the communication device may be integrated within the motor drive or motor starter, providing direct communication with an external controller. The motor control unit 100 is configured to receive control signals, data signals, data packets via the network, or a combination thereof to achieve desired operation of the motor controlled by the motor control unit.

Figure 5:
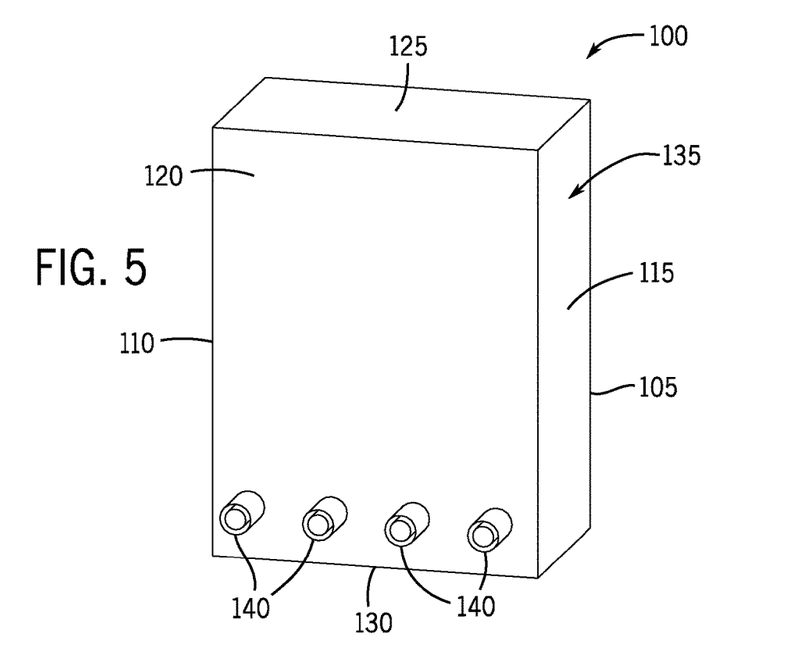
FIG. 5 is a block representation of the motor control unit of FIG. 4.

With reference to FIG. 5, a simplified representation of the motor control unit 100 is illustrated in block form. The block form is used for ease of description and is not intended to be limiting. Directional terms used herein are for reference with respect to the illustrated figure and are not intended to be limiting as components may be mounted in different orientations or on opposite sides or locations within the motor control unit 100. As seen in FIG. 5, the motor control unit 100 includes a front surface 105, a first unit side 110, a second unit side 115, rear surface 120, top surface 125, and bottom surface 130. The rear surface 120 is located opposite from the front surface 105, with the first unit side 110 and the second unit side 115 extending between the front and rear surfaces. The top surface 125 and bottom surface 130 are located opposite from each other and both further extend between the first unit side 110 and the second unit side 115, as well as between the rear surface 120 and the front surface 105. Together, the unit surfaces and sides 105, 110, 115, 120, and 130 form a motor control unit housing 135. The rear surface 120 includes a series of pogo, or spring-loaded, pins 140 extending therefrom, and are configured to engage the terminal pads 60 on the circuit board 55 in the motor control center 5.

Each of the spring-loaded pins 140 are electrically connected within the motor control unit housing 135. With reference to FIG. 3, a circuit board 170 is shown at the rear of the motor control unit 100. The other elements of the motor control unit 100 are not illustrated as they would be located in front of and obscure the view of the circuit board 170. The other elements of the motor control unit 100 may include, for example, a circuit breaker, a motor drive, a contactor and the like. The rear of each spring-loaded pin 140 is shown extending through the circuit board 170. The pin 140 may first be mechanically mounted to the circuit board 170 and then an electrical connection established between the circuit board 170 and the pin 140. The pin 140 extends from the rear of the circuit board 170 and through the rear of the motor control unit housing 135.

Figure 6:
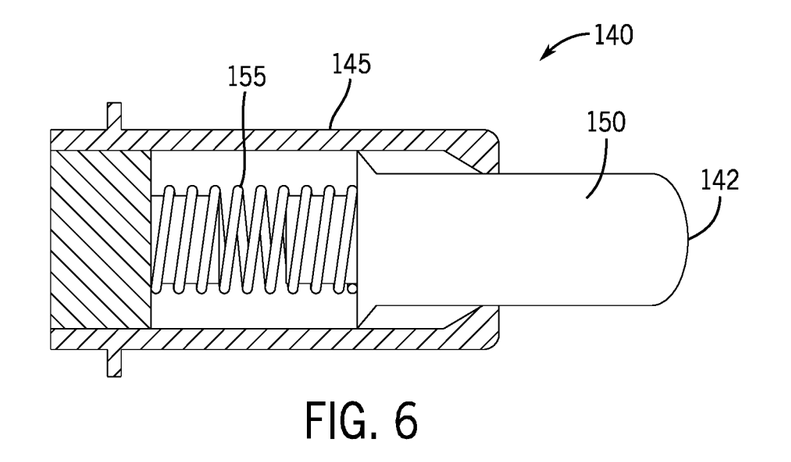
FIG. 6 is a sectional view of a spring-loaded pin of FIG. 4 in a first position.
Figure 7:
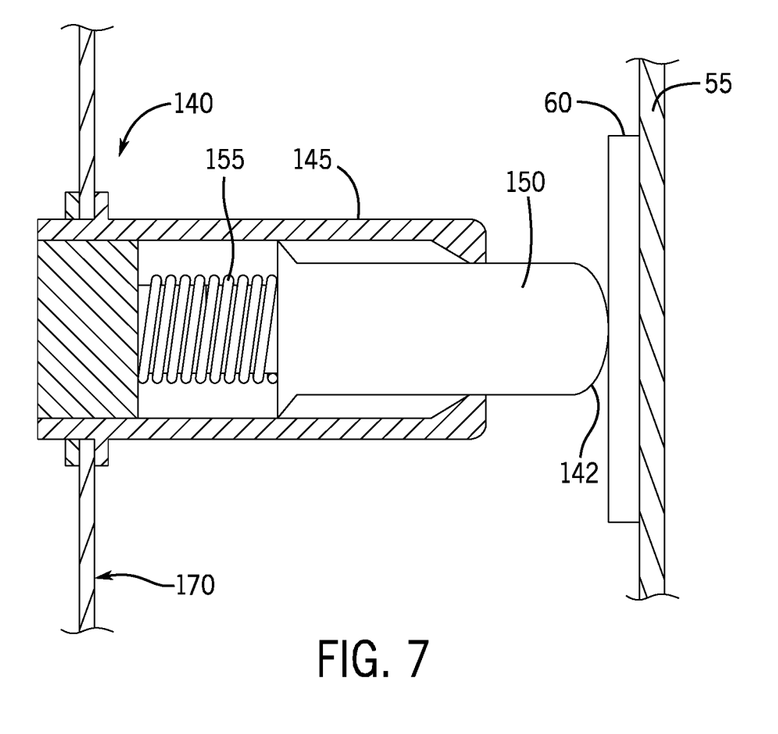
FIG. 7 is a sectional view of the spring-loaded pin of FIGS. 4 and 6 in a second position and in contact with the motor control center.

Each spring-loaded pin 140 includes a barrel 145, plunger 150 and spring 155, illustrated in FIGS. 6 and 7. In one embodiment, the barrel 145 and plunger 150 may be hollow tubes shaped and sized so that the plunger 150 has a smaller diameter than the barrel 145. The plunger is mounted within the barrel 145 and is positively retained by the barrel 145. According to the illustrated embodiment, an end of the plunger 150 located within the barrel 145 has a flared end and an interior periphery of the barrel 145 is tapered such that the flared end of the plunger 150 cannot pass through the end of the barrel 145. The diameter of the flared end of the plunger 150 remains less than the diameter of the inner periphery of the barrel 145 such that the plunger 150 may extend or collapse within the barrel 145 in a telescoping manner. The end of the barrel 145 opposite the plunger 150 is closed to prevent the plunger 150 from exiting and providing a spring seat against which one end of the spring 155 may be seated. The spring 155 is further positioned within the barrel 145 such that the end of the spring 155 opposite the spring seat engages the plunger 150 and applies a biasing force against the plunger 150 to cause the plunger 150 to extend from the barrel 145, allowing the plunger 150 to contact or engage with the corresponding terminal pad 60 when the motor control unit 100 is selectively engaged with the motor control center 5.

In operation, the pins 140 on the motor control unit 100 are able to selectively engage with the terminal contacts 60 on the circuit board 55 in the motor control center 5 to establish electrical connections between the motor control unit 100 and the control and/or network connections made to the circuit board 55 in the motor control center 5. Because a motor control unit 100 is inserted into the compartment 45 of the motor control center 5 and typically includes a form factor that fills the sectional area of the compartment 45, the rear surface 120 of the motor control housing 135 is not visible during insertion. Likewise, the spring-loaded pins 140 are not visible and must establish a blind electrical connection between the motor control unit 100 and the motor control center 5, where a blind electrical connection means that a technician is not able to visibly observe the electrical connection being established.

The spring-loaded pins 140 on the motor control unit 100 and the terminal pads 60 in the motor control center 5 allow for the blind electrical connection to be established, where no mating insertion (e.g., pin and socket or male and female engagement) between connectors on the motor control center 5 and motor control unit 100 is required.

When the motor control unit 100 is inserted in the motor control center 5, the at least one pin 140 transitions, from a first, uncompressed position, to a second, compressed position. With reference to FIGS. 6 and 7, the pin 140 of the motor control unit 100 is in a first, extended position, as shown in FIG. 6, when the motor control unit 100 is not selectively engaged with the motor control center 5. As the motor control unit 100 is inserted into a compartment 45, the end of the pin 140 engages a terminal pad 60, applying a compressive force to the spring 155. The pin transitions from the first position and to the second position during the insertion. When the motor control unit 100 is fully inserted, the pin 140 is fully compressed into its second position, as shown in FIG. 7, and the end 142 of the pin 140 engages the terminal pad 60 on the printed circuit board 55, shown in FIG. 7.

The terminal pads 60 on the printed circuit board 55 in the motor control center 5 are arranged in a pattern that corresponds to the positioning of each of the pins 140 on the circuit board 170 in the motor control unit. When the motor control unit 100 is selectively engaged in the motor control center 5, each of the pins 140 on the motor control unit 100 engages and forms a connection with a corresponding terminal pad 60 on the printed circuit board 55. The spring 155 biases the plunger 150 outwards or away from the rear surface 120 to ensure the plunger 150 makes contact with the corresponding terminal pad 60 when the motor control unit 100 is fully inserted. Thus, as the motor control unit 100 selectively engages the motor control center 5, an electrical connection is formed and maintained without requiring wires from the wireway 44 to be plugged in or otherwise connected to the motor control unit 100. The electrical connection establishes electronic communication between the motor control unit 100 and the control signals and/or network connections within the motor control center 5. Similarly, the motor control unit 100 may be removed from the motor control center 5 by simply pulling it out of the motor control center 5 to disengage the electrical connection and/or disconnect the data connection without unplugging or otherwise disconnecting wires from the wireway 44.

In order to facilitate this blind connection, each of the terminal pads 60 may have an outer diameter that is greater than the diameter of the plunger 150. Thus, as the motor control unit 100 is inserted into the motor control center 5, there is some tolerance within which the spring-loaded pin 140 can move from side-to-side or up-and-down and still establish contact with the printed circuit board 55. Even though the motor control unit 100 is configured to fit within a compartment 45 of the motor control center 5, there is typically some physical tolerance around the motor control unit 100, which permits some minor side-to-side or up-and-down motion of the motor control unit 100 as it is inserted such that there is not a friction fit between surfaces of the motor control unit 100 and the motor control center 5. The larger size of the terminal pad 60 accounts for this tolerance, where a typical mating insertion may require a more precise alignment, particularly as the number of pins increases. The blind connection of the disclosed spring-loaded pin 140 and terminal pad 60 allows for larger tolerances in the engagement of the motor control unit 100 and motor control center 5 because the pin 140 is not required to fit within a corresponding socket. Instead, the pin 140 just needs to make contact with the terminal pad 60 which provides a larger target or contact area for each pin 140.

In addition to providing a larger contact area and increased tolerance side-to-side and up-and-down directions between the pin 140 and the terminal pad 60, the present invention provides an improved depth tolerance for the electrical connection. The spring-loaded pin 140 may be compressed a greater or lesser distance and still maintain an electrical connection between the end 142 of the pin 140 and the terminal pad 60 due to the spring 155 biasing the plunger 150 forwards towards the terminal pad 60. In contrast, a typical mating connector requires a pin be inserted a certain distance to establish an electrical connection and resists insertion beyond that distance. Thus, the spring-loaded pin 140 and terminal pad 60 configuration allows for greater tolerances for establishing the desired electrical connection between the motor control unit 100 and the motor control center 5.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

We claim:

1. A motor control center for industrial equipment comprising:
   at least one power bus configured to receive power from a power supply and to distribute the power within the motor control center;
   a plurality of compartments, wherein each of the plurality of compartments is configured to receive a motor control unit; and
   a plurality of terminals mounted within each of the plurality of compartments, wherein
      the plurality of terminals are configured to engage at least one pin extending from the motor control unit as the motor control unit is inserted within one of the plurality of compartments,
      each of the plurality of terminals causes the at least one pin to transition from a first position to a second position as the at least one pin is engaged, and
      an electrical connection is established between the motor control center and the motor control unit by the at least one pin engaging one of the plurality of terminals.

2. The motor control center of claim 1, wherein each of the plurality of terminals is a connector having a mating surface configured to receive the at least one pin.

3. The motor control center of claim 1, further comprising a plurality of circuit boards, wherein:
   each of the plurality of circuit boards is mounted within one of the plurality of compartments, and
   each of the plurality of terminals is a terminal pad mounted on one of the plurality of circuit boards.

4. The motor control center of claim 1, wherein:
   each of the plurality of terminals has a first diameter,
   the at least one pin has a second diameter, and
   the first diameter is greater than the second diameter.

5. The motor control center of claim 1, further comprising the motor control unit and the at least one pin extending from the motor control unit, wherein the motor control unit is configured to mount within one of the plurality of compartments.

6. The motor control center of claim 5, further comprising a plurality of wires, wherein:
   each of the plurality of wires is electrically connected to one of the plurality of terminals;

each of the plurality of wires is configured to conduct a control signal, a data signal, or a data packet;

the motor control unit comprises at least one electrical device configured to receive the control signal, the data signal, or the data packet, and the electrical connection is established between each of the plurality of wires and the motor control unit by the at least one pin engaging one of the plurality of terminals.

7. The motor control center of claim 5, wherein the at least one pin of the motor control unit is spring-loaded.

8. The motor control center of claim 5, wherein the at least pin of the motor control unit includes a plurality of spring-loaded pins.

9. A motor control unit for insertion into a compartment of a motor control center, the motor control unit comprising:
   at least one electrical device configured to receive a control signal, a data signal, or a data packet corresponding to a desired operation of the electrical device;
   a first printed circuit board; and
   at least one pin mounted to the first printed circuit board, wherein:
      the at least one pin is configured to engage one of a plurality of terminal pads mounted on a second printed circuit board located within the compartment of the motor control center,
      the at least one pin is configured to transition from a first position to a second position upon insertion of the motor control unit into the compartment of the motor control center,
      an electrical connection is established between the motor control center and the motor control unit by the at least one pin engaging the one of the plurality of terminal pads, and
      the control signal, the data signal, or the data packet is conducted to the motor control unit from the motor control center via the electrical connection.

10. The motor control unit of claim 9, wherein the at least one pin is spring-loaded.

11. The motor control unit of claim 9, wherein the at least pin includes a plurality of spring-loaded pins.

12. The motor control unit of claim 9, wherein the at least on pin further comprises:
   a barrel,
   a plunger slidably positioned within and positively retained by the barrel, and
   a spring mounted within the barrel and configured to apply a biasing force against the plunger.

13. The motor control unit of claim 12, wherein:
   each of the plurality of terminal pads has a first diameter,
   the plunger of the spring-loaded pin has a second diameter,
   the first diameter is greater than the second diameter.

14. The motor control unit of claim 9, further comprising at least one power stab mounted to the motor control unit to establish a power connection with the motor control unit, wherein the compartment includes at least one power receptacle connected to at least one power bus within the motor control center and wherein the at least one power stab receives power for the motor control unit from the at least one power bus via the at least one power receptacle.

15. A method of selective engagement and disengagement between a motor control unit and a motor control center, the method comprising the step of manually inserting the motor control unit into a compartment on the motor control center, wherein, the manual insertion further comprises the steps of:
   inserting at least one power stab, mounted to the motor control unit, into a power receptacle within the motor control center,
   establishing a first electrical connection to deliver power from a power bus within the motor control center to the motor control unit via the power receptacle and the at least one power stab by manually inserting the motor control unit,
   transitioning at least one pin mounted to the motor control unit from a first position to a second position, wherein the at least one pin engages a corresponding terminal within the motor control center during insertion, and
   establishing a second electrical connection to deliver a control signal, data signal, or data packet from the motor control center to the motor control unit via the at least one pin and the corresponding terminal while inserting the motor control unit without requiring an additional plug connection between the motor control center and the motor control unit.

16. The method of claim 15, wherein the at least one pin includes
   a barrel,
   a plunger slidably positioned within and positively retained by the barrel, and
   a spring mounted within the barrel and configured to apply a biasing force against the plunger.

17. The method of claim 16, wherein the biasing force of the spring pushes the plunger to the first position when the motor control unit is removed from the compartment and engagement of the at least one pin with the corresponding terminal compresses the spring, moving the plunger to the second position when the motor control unit is inserted into the compartment.

18. The method of claim 15, wherein the corresponding terminal is a connector having a mating surface configured to receive the at least one pin.

19. The method of claim 15, wherein the corresponding terminal is a terminal pad mounted on a circuit board within the compartment of the motor control center.

20. The method of claim 15, wherein the motor control unit is selectively disengaged from the motor control center by manually sliding the motor control unit from the compartment without requiring an additional plug being disconnected from the motor control unit.

* * * * *